US012495500B2

United States Patent
Shi et al.

(10) Patent No.: US 12,495,500 B2
(45) Date of Patent: Dec. 9, 2025

(54) FLEXIBLE DISPLAY MODULE AND MANUFACTURING METHOD THEREOF

(71) Applicants: Chengdu BOE Optoelectronics Technology Co., Ltd., Sichuan (CN); BOE Technology Group Co., Ltd., Beijing (CN)

(72) Inventors: Jiafan Shi, Beijing (CN); Liqiang Chen, Beijing (CN); Changbo Liu, Beijing (CN); Zuojia Wang, Beijing (CN); Qingsong Wang, Beijing (CN); Chao Zhou, Beijing (CN); Yongchun Jiang, Beijing (CN); Qian Yin, Beijing (CN); Ziqi Song, Beijing (CN)

(73) Assignees: Chengdu BOE Optoelectronics Technology Co., Ltd., Sichuan (CN); Beijing BOE Technology Development Co., Ltd., Beijing (CN)

( * ) Notice: Subject to any disclaimer, the term of this patent is extended or adjusted under 35 U.S.C. 154(b) by 0 days.

(21) Appl. No.: 18/641,420

(22) Filed: Apr. 21, 2024

(65) Prior Publication Data

US 2024/0268029 A1 Aug. 8, 2024

Related U.S. Application Data

(63) Continuation of application No. 18/203,593, filed on May 30, 2023, now Pat. No. 12,010,798, which is a
(Continued)

(30) Foreign Application Priority Data

Jan. 29, 2021 (CN) .......................... 202110126902.X
Mar. 31, 2021 (CN) .......................... 202110349782.X

(51) Int. Cl.
*H05K 1/14* (2006.01)
*G09F 9/30* (2006.01)
(Continued)

(52) U.S. Cl.
CPC ............. *H05K 1/147* (2013.01); *G09F 9/301* (2013.01); *H05K 1/0203* (2013.01); *H05K 1/028* (2013.01);
(Continued)

(58) Field of Classification Search
CPC ................... H05K 1/147; H05K 1/028; H05K 2201/10128; H05K 1/189; H05K 1/0203;
(Continued)

(56) References Cited

U.S. PATENT DOCUMENTS

| | | |
|---|---|---|
| 2010/0224785 A1 | 9/2010 | Chiyoma et al. |
| 2014/0042406 A1 | 2/2014 | Degner et al. |

(Continued)

FOREIGN PATENT DOCUMENTS

| | | |
|---|---|---|
| CN | 107942563 A | 4/2018 |
| CN | 110828411 A | 2/2020 |
| CN | 111338511 A | 6/2020 |

OTHER PUBLICATIONS

U.S. Appl. No. 17/539,549 Non-Final Rejection dated Dec. 15, 2022.
(Continued)

*Primary Examiner* — Steven T Sawyer
(74) *Attorney, Agent, or Firm* — IPro, PLLC

(57) ABSTRACT

A flexible display module includes a flexible display panel, a driving chip and a circuit board. The flexible display panel includes a display region and a bonding region arranged at a side of the display region opposite to a light-exiting side, and a bending region between the display region and the bonding region. The flexible display module further includes a flexible substrate supporting the flexible display panel, the flexible substrate includes a first flexible substrate and a second flexible substrate. The circuit board is connected to the other end of the second flexible substrate at a first
(Continued)

position. An orthographic projection of the driving chip onto a plane where the first flexible substrate is located and an orthographic projection of the bending region onto the plane where the first flexible substrate is located are both located on a same side of a first vertical line.

20 Claims, 7 Drawing Sheets

Related U.S. Application Data continuation of application No. 17/539,549, filed on Dec. 1, 2021, now Pat. No. 11,706,872.

(51) Int. Cl.
*H05K 1/02* (2006.01)
*H05K 1/18* (2006.01)

(52) U.S. Cl.
CPC ........... *H05K 1/0298* (2013.01); *H05K 1/189* (2013.01); *H05K 2201/10128* (2013.01)

(58) Field of Classification Search
CPC ......... H05K 2201/10136; H05K 1/148; H05K 2201/042; H05K 2201/058; H05K 2201/10681; G09F 9/301; G02F 1/13452; G06F 3/0412; G06F 3/041; G06F 1/1637; G06F 1/1652

See application file for complete search history.

(56) References Cited

U.S. PATENT DOCUMENTS

| | | |
|---|---|---|
| 2014/0184057 A1 | 7/2014 | Kim et al. |
| 2014/0240933 A1 | 8/2014 | Lee et al. |
| 2014/0307396 A1 | 10/2014 | Lee |
| 2017/0006738 A1 | 1/2017 | Lee et al. |
| 2017/0170255 A1 | 6/2017 | Ha et al. |
| 2018/0005948 A1 | 1/2018 | Jo et al. |
| 2020/0022261 A1 | 1/2020 | Choi |

OTHER PUBLICATIONS

U.S. Appl. No. 17/539,549 Notice of Allowance dated Mar. 22, 2023.
U.S. Appl. No. 18/203,593 Notice of Allowance dated Feb. 6, 2024.

FLEXIBLE DISPLAY MODULE AND MANUFACTURING METHOD THEREOF

CROSS-REFERENCE TO RELATED APPLICATION

The present application claims the benefit of and is a continuation application of U.S. patent application Ser. No. 18/203,593 filed on May 30, 2023. U.S. patent application Ser. No. 18/203,593 claims the benefit of and is a continuation application of U.S. patent application Ser. No. 17/539,549 filed on Dec. 1, 2021. U.S. patent application Ser. No. 17/539,549 claims priorities of the Chinese patent application No. 202110126902.X filed on Jan. 29, 2021 and the Chinese patent application No. 202110349782.X filed on Mar. 31, 2021. The entire contents of each of the above-listed applications are hereby incorporated by reference for all purposes.

TECHNICAL FIELD

The present disclosure relates to the field of display technology, in particular to a flexible display module and a method for manufacturing the flexible display module.

BACKGROUND

Along with the development of display technology, various novel technologies have emerged continuously. Along with the development of flexible display technology, a flexible display panel has emerged to meet people's new requirement on display. Currently, the flexible display panel has already been widely applied to such fields as smart wearable devices and smart mobile phones. There is a strong demand for a flexible display panel electronic device with a smaller size, a narrower bezel and more excellent performance.

SUMMARY

In one aspect, the present disclosure provides in some embodiments a flexible display module, including a flexible display panel, and a driving chip and a circuit board arranged on the flexible display panel. The flexible display panel includes a display region and a bonding region arranged at a side of the display region opposite to a light-exiting side, and the driving chip and the circuit board are arranged at the bonding region. The circuit board includes a first flexible printed circuit, and a first printed circuit board provided with an electronic element and coupled to one end of the first flexible printed circuit, and the first flexible printed circuit includes a bonded portion coupled to the bonding region of the flexible display panel. A first space is defined by the first flexible printed circuit, the first printed circuit board and the flexible display panel through bending the first flexible printed circuit, and the electronic element is received in the first space.

In a possible embodiment of the present disclosure, the first printed circuit board is a multi-layer printed circuit board, and the first flexible printed circuit is coupled to any layer of the first printed circuit board.

In a possible embodiment of the present disclosure, the first printed circuit board is arranged at a side of the driving chip away from the flexible display panel, the electronic element is arranged at a surface of the first printed circuit board facing the flexible display panel, and the driving chip is received in the first space.

In a possible embodiment of the present disclosure, the flexible display module includes a first adhesive arranged at the bonding region of the flexible display panel and surrounding the driving chip, and the electronic element is adhered to the bonding region of the flexible display panel through the first adhesive.

In a possible embodiment of the present disclosure, the first adhesive is a foam adhesive tape.

In a possible embodiment of the present disclosure, the circuit board further includes a second flexible printed circuit and a second printed circuit board, the second flexible printed circuit is coupled to one end of the first printed circuit board away from the first flexible printed circuit, a second space is defined by the second printed circuit board, the second flexible printed circuit and the first printed circuit board through bending the second flexible printed circuit, and an electronic element of the second printed circuit board is received in the second space.

In a possible embodiment of the present disclosure, the second printed circuit board includes a second adhesive arranged on a surface where the electronic element is located, and the second printed circuit board is adhered to the first printed circuit board through the second adhesive.

In a possible embodiment of the present disclosure, the second adhesive is an insulating double-sided adhesive tape.

In a possible embodiment of the present disclosure, the flexible display module further includes a flexible substrate and a heat dissipation film, the flexible substrate includes a first flexible substrate and a second flexible substrate, the display region of the flexible display panel is arranged at one side of the first flexible substrate, the heat dissipation film is arranged at the other side of the first flexible substrate, the bonding region of the flexible display panel is arranged on the second flexible substrate, the first printed circuit board is arranged at a side of the second flexible substrate adjacent to the heat dissipation film, and the electronic element is arranged at a surface of the first printed circuit board facing the second flexible substrate.

In a possible embodiment of the present disclosure, the first printed circuit board includes a third adhesive and a fourth adhesive arranged at opposite surfaces respectively, the first printed circuit board is adhered to the second flexible substrate through the third adhesive, and the first printed circuit board is adhered to the heat dissipation film through the fourth adhesive.

In a possible embodiment of the present disclosure, the third adhesive, the first printed circuit board and the fourth adhesive have a total thickness of 0.15 mm to 0.3 mm.

In a possible embodiment of the present disclosure, the third adhesive and the fourth adhesive are each a foam adhesive tape or an insulating double-sided adhesive tape.

In a possible embodiment of the present disclosure, an orthogonal projection of the electronic element onto the heat dissipation film is outside an orthogonal projection of the second flexible substrate onto the heat dissipation film.

In another aspect, the present disclosure provides in some embodiments a method for manufacturing the above-mentioned flexible display module, including: enabling the first flexible printed circuit to be bonded to the bonding region of the flexible display panel through the bonded portion; bending the first flexible printed circuit so that a first space is defined by the first flexible printed circuit, the first printed circuit board and the flexible display panel, the electronic element being received in the first space; and bending the flexible display panel so that the bonding region is arranged at a side of the display region opposite to the light-exiting side.

In a possible embodiment of the present disclosure, the bending the first flexible printed circuit so that the first space is defined by the first flexible printed circuit, the first printed circuit board and the flexible display panel includes bending the first flexible printed circuit and enabling the first printed circuit board to move in a direction close to the driving chip, so that the first printed circuit board is arranged at a side of the driving chip away from the flexible display panel and the first space is defined by the first flexible printed circuit, the first printed circuit board and the bonding region. The electronic element is arranged at a surface of the first printed circuit board facing the flexible display panel, and the driving chip is received in the first space.

In a possible embodiment of the present disclosure, subsequent to enabling the first flexible printed circuit to be bonded to the bonding region of the flexible display panel through the bonded portion, the method further includes attaching a first adhesive in such a manner as to surround the driving chip on a surface of the flexible display panel where the driving chip is located. Subsequent to bending the first flexible printed circuit and enabling the first printed circuit board to move in the direction close to the driving chip so that the first printed circuit board is arranged at the side of the driving chip away from the flexible display panel and the first space is defined by the first flexible printed circuit, the first printed circuit board and the bonding region, the method further includes enabling the electronic element of the first printed circuit board to be in contact with, and adhered to, the first adhesive on the flexible display panel.

In a possible embodiment of the present disclosure, the first adhesive is a foam adhesive tape.

In a possible embodiment of the present disclosure, the flexible display module further includes a flexible substrate and a heat dissipation film, the flexible substrate includes a first flexible substrate and a second flexible substrate, the display region of the flexible display panel is arranged at one side of the first flexible substrate, the heat dissipation film is arranged at the other side of the first flexible substrate, and the bonding region of the flexible display panel is arranged on the second flexible substrate. The bending the first flexible printed circuit so that the first space is defined by the first flexible printed circuit, the first printed circuit board and the flexible display panel includes bending the first flexible printed circuit so that the first printed circuit board is arranged at a side of the second flexible substrate away from the flexible display panel. The electronic element is arranged on a surface of the first printed circuit board facing the second flexible substrate. The bending the flexible display panel includes bending the flexible display panel and the flexible substrate so that the first printed circuit board is attached to the heat dissipation film.

In a possible embodiment of the present disclosure, the first printed circuit board is a multi-layer printed circuit board. Prior to enabling the first flexible printed circuit to be bonded to the bonding region of the flexible display panel through the bonded portion, the method further includes enabling the first flexible printed circuit to be coupled to any layer of the first printed circuit board through a via-hole.

BRIEF DESCRIPTION OF THE DRAWINGS

The present disclosure will be described hereinafter in details in conjunction with the drawings.

DETAILED DESCRIPTION

Figure 1:
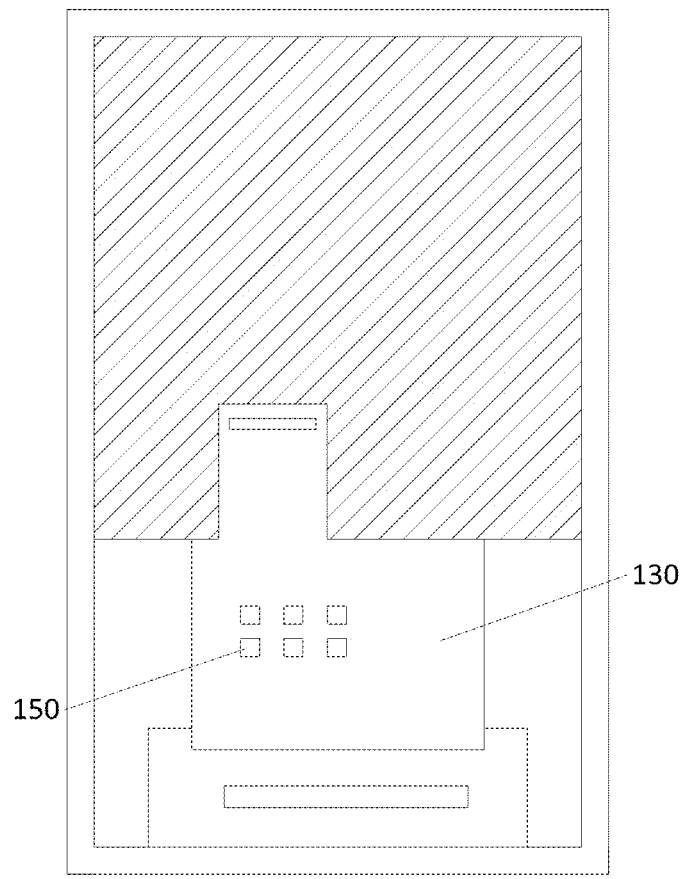
FIG. 1 is a top view of a flexible printed circuit on a flexible display module in the related art.

In the embodiments of the present disclosure, such words as "on/above" and "under/below" are used to indicate directions or positions as viewed in the drawings, and they are merely used to facilitate the description in the present disclosure, rather than to indicate or imply that a device or member must be arranged or operated at a specific position. Unless otherwise specified, such words as "mount", "arrange" and "connect/couple" have a general meaning, e.g., the word "connect" may refer to fixed connection, removable connection or integral connection, or mechanical or electrical connection, or direct connection or indirect connection via an intermediate component, or communication between two components. The meanings of these words may be understood by a person skilled in the art in accordance with the practical need.

It should be appreciated that, although such words as "first" and "second" are used to describe various members, components, elements, regions, layers and/or portions, these members, components, elements, regions, layers and/or portions shall not be limited by these words. These words are used to differentiate one member, component, element, region, layer and/or portion from the other. Hence, a first member, a first component, a first element, a first region, a first layer and/or a first portion discussed hereinafter may also be called as a second member, a second component, a second element, a second region, a second layer and/or a second portion, without departing from the teaching of the present disclosure.

It should be further appreciated that, such words as "first" and "second" are merely used to separate one entity or operation from another entity or operation, but are not necessarily used to represent or imply any relation or order between the entities or operations. In addition, such terms as "include" or "including" or any other variations involved in the present disclosure intend to provide non-exclusive coverage, so that a procedure, method, article or device including a series of elements may also include any other elements not listed herein, or may include any inherent elements of the procedure, method, article or device. If without any further limitations, for the elements defined by such sentence as "including one . . . ", it is not excluded that the procedure, method, article or device including the elements may also include any other identical elements.

In the related art, for an electronic product with a flexible display panel, it is required to reserve a large space in an effective space for receiving a battery and a mainboard, so as to increase a battery life and a computing speed, thereby to improve the competitiveness of the electronic product. In addition, along with the continuous development of the flexible display panel technology, the price competition for the electronic product is increasingly fierce, so, in order to improve the market competitiveness of the electronic product, it is necessary to reduce the manufacture cost while improving the performance thereof.

Figure 2:
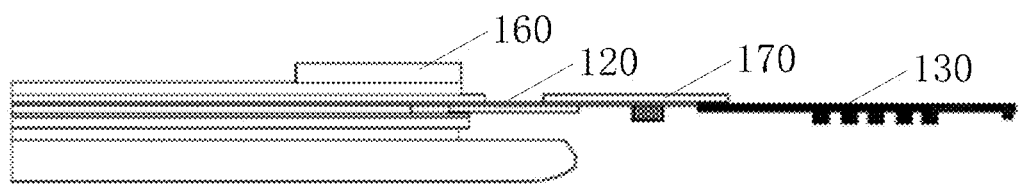
FIGS. 2 and 3 are schematic views showing the formation of the flexible display module in the related art.
Figure 3:
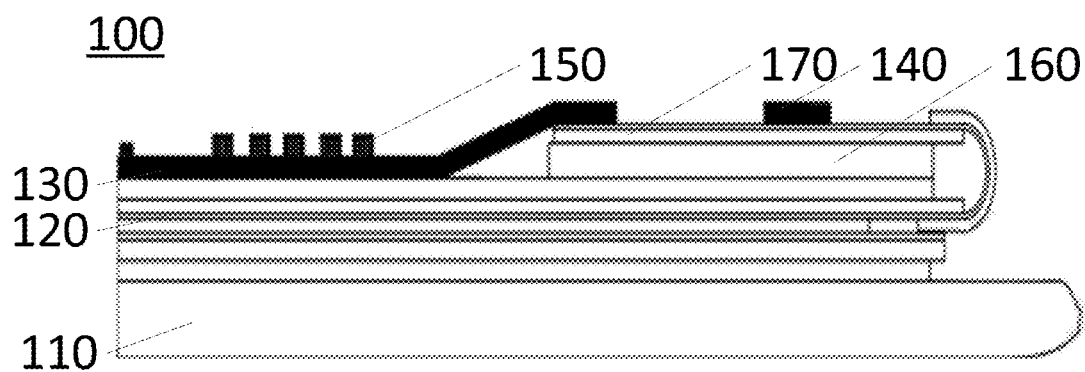

As an important part for enabling the flexible display panel to be energized and controlled by a driving chip, a circuit board in the electronic product is an important information transmission channel between a whole-machine element and the flexible display panel. In the related art, the circuit board adopted by a smart wearable device and a smart mobile phone is a Flexible Printed Circuit (FPC). As shown in FIGS. 1 to 3, a conventional flexible display module 100 includes a cover plate 110, a flexible display panel 120, and an FPC 130 and a driving chip 140 arranged on a back surface of the flexible display panel 120. The FPC 130 occupies a large space, and a capacitor/inductor 150 is arranged on an upper surface of the FPC 130, so it is limited when other structural elements desired for the whole-machine element is arranged above the FPC 130. For example, the capacitor/inductor 150 on the upper surface of the FPC 130 easily collides with the whole-machine element above the capacitor/inductor 150, and thereby the capacitor/inductor 150 may be damaged. In addition, when the FPC 130 occupies a large space, an available space for the whole-machine element (e.g., a slashed region in FIG. 1) is reduced, so it is very difficult to assemble and place the whole-machine elements (e.g., a battery and a mainboard). At this time, the overall performance of the flexible display module is deteriorated and a recognition degree of the electronic product is adversely affected.

FIGS. 2 and 3 show the formation of the conventional flexible display module 100. Due to the limitation on a bending radius of the flexible display panel 120, usually a spacer 160 is provided for a gap caused when bending the flexible display panel 120. As shown in FIG. 2, the spacer 160 is attached at a corresponding position, and then the flexible display panel 120 is bent so that a flexible substrate 170 is attached to the spacer 160 to form a structure as shown in FIG. 3. However, due to the spacer 160 and an additional process of attaching the spacer 160, the cost of the flexible display module 100 may increase inevitably. In addition, a defective product may occur when the spacer 160 is attached at a wrong position, so the yield may be adversely affected.

In order to solve the problems in the related art, the present disclosure provides in some embodiments a flexible display module 200 which, as shown in FIGS. 4 to 11, includes a flexible display panel 210, and a driving chip 220 and a circuit board 230 arranged on the flexible display panel 210. The flexible display panel includes a display region 211, a bonding region 212 arranged at a side of the display region 211 opposite to a light-exiting side, and a bending region 213 between the display region 211 and the bonding region 212, i.e., the bonding region 212 is arranged above the display region 211 in FIG. 5 through bending the bending region 213. The driving chip 220 and the circuit board 230 are arranged at the bonding region 212, and the driving chip 220 is coupled to an external driving circuitry.

It should be appreciated that, in a possible embodiment of the present disclosure, the flexible display module 200 further includes a flexible substrate 240 supporting the flexible display panel 210, and a heat dissipation film 250. The flexible substrate 240 includes a first flexible substrate 241 and a second flexible substrate 242. The display region 211 of the flexible display panel 210 is arranged at one side of the first flexible substrate 241, and the heat dissipation film 250 is arranged at the other side of the first flexible substrate 241 and opposite to the display region 211 of the flexible display panel 210. The bonding region 212 of the flexible display panel 210 is arranged on the second flexible substrate 242. A gap region corresponding to the bending region 213 of the flexible display panel 210 is arranged between the first flexible substrate 241 and the second flexible substrate 242.

Figure 4A:
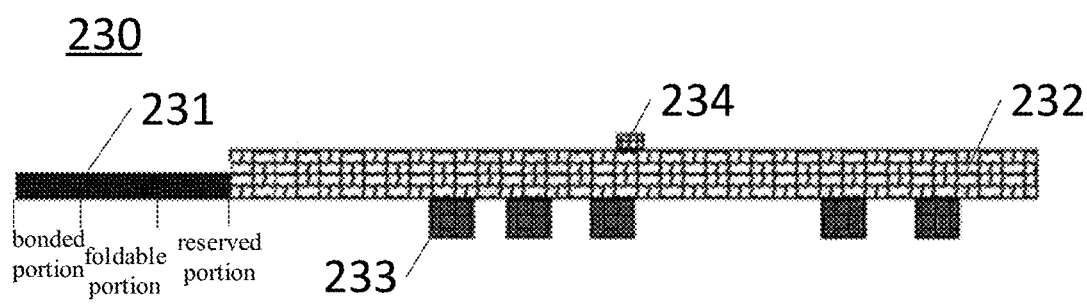
FIGS. 4a and 4b are schematic views showing a circuit board according to the embodiments of the present disclosure.
Figure 4B:
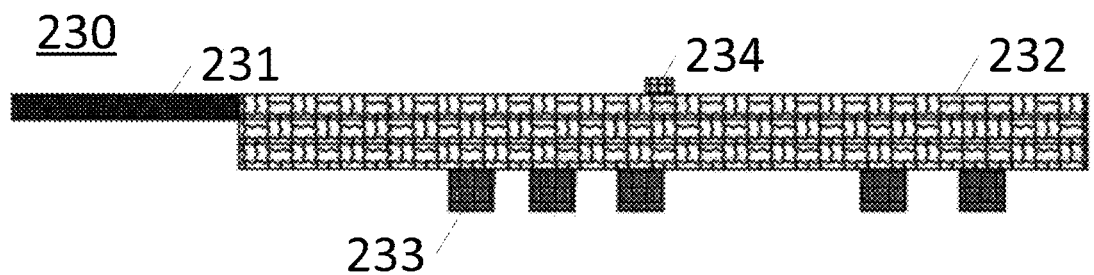

In the embodiments of the present disclosure, FIGS. 4a and 4b show a structure of the circuit board 230. The circuit board 230 includes a first FPC 231 and a first Printed Circuit Board (PCB) 232 provided with an electronic element and coupled to one end of the first FPC 231. In a specific embodiment of the present disclosure, the first PCB 232 is coupled to the first FPC 231 through a via-hole to form a closed circuit.

The first FPC 231 includes a bonded portion bonded to the bonding region 212 of the flexible display panel 210, as shown in FIG. 4a. For example, the bonded portion of the first FPC 231 is bonded to the bonding region 212 of the flexible display panel 210 through a pin, so as to transmit a signal. In a specific embodiment of the present disclosure, the first FPC 231 further includes a foldable portion and a reserved portion, and the bonded portion, the foldable portion and the reserved portion are arranged from one end of the first FPC 231 away from the first PCB 232 to the other end of the first FPC 231 coupled to the first PCB 232.

Through bending the foldable portion of the first FPC 231, it is able to fold the first FPC 231 forwardly or backwardly, thereby to control the first PCB 232 to rotate in different directions to move close to the flexible display panel 210.

In a specific embodiment of the present disclosure, the reserved portion has a width of 0.5 mm to 1 mm, and the first FPC 231 has a length equal to a sum of a width of the bonded portion, a width of the foldable portion and the width of the reserved portion.

The first PCB 232 and the first FPC 231 are combined to form the foldable circuit board 230. The circuit board 230 is capable of being folded forwardly or backwardly on a back surface of the display region of the flexible display panel 210 (i.e., the bonding region 212 of the flexible display panel 210). In other words, the first FPC 231 is folded forwardly or backwardly so that the first PCB 232 rotates in a clockwise or counterclockwise direction to move close to the flexible display panel 210. In a specific embodiment of the present disclosure, the first FPC 231 is capable of being folded at a radius of 0.5 mm to 1.5 mm.

Figure 10:
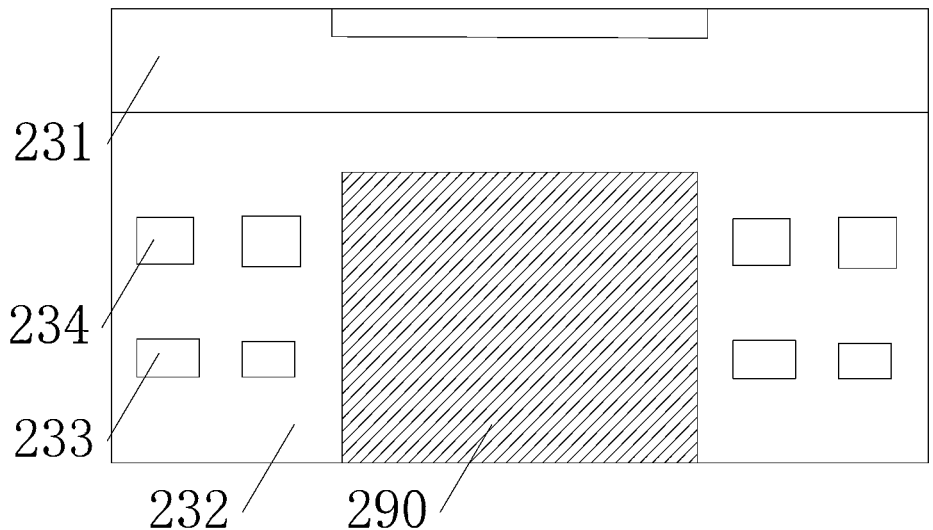
FIG. 10 is a top view of the circuit board according to one embodiment of the present disclosure.

In a specific embodiment of the present disclosure, as shown in FIGS. 4a and 4b, an electronic element 233 is arranged at a side surface of the first PCB 232, and a connector 234 is arranged at a side surface of the first PCB 232 away from the electronic element 233. For example, the electronic element 233 is such a vulnerable member as capacitor/inductor, and the connector 234 is coupled to a mainboard or a processor of a whole machine. As compared with the FPC, the elements are arranged at a larger density on the PCB, so as to allow more electronic elements to be arranged, thereby to provide a larger space for the whole-machine elements. In another specific embodiment of the present disclosure, as shown in FIG. 10, the electronic element 233 and the connector 234 are arranged at a same side surface of the first PCB 232.

The first FPC 231 is bent to drive the first PCB 232 to rotate in a direction close to the bonding region 212 of the flexible display panel 210, so as to define the first space by the first FPC 231, the first PCB 232 and the flexible display panel 210. The electronic element 233 is received in the first space.

Figure 7:
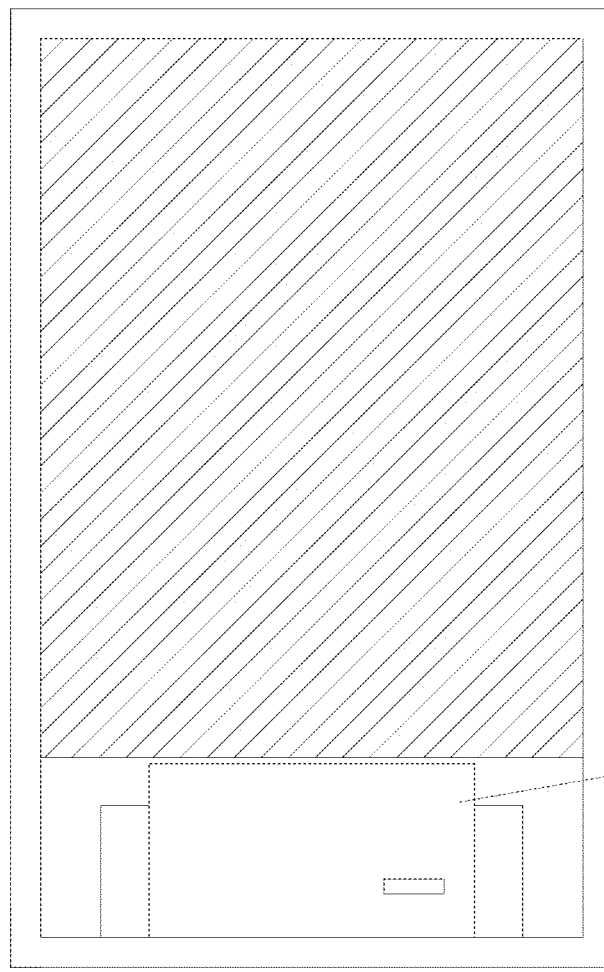
FIG. 7 is a top view of the flexible display module according to one embodiment of the present disclosure.
Figure 9:
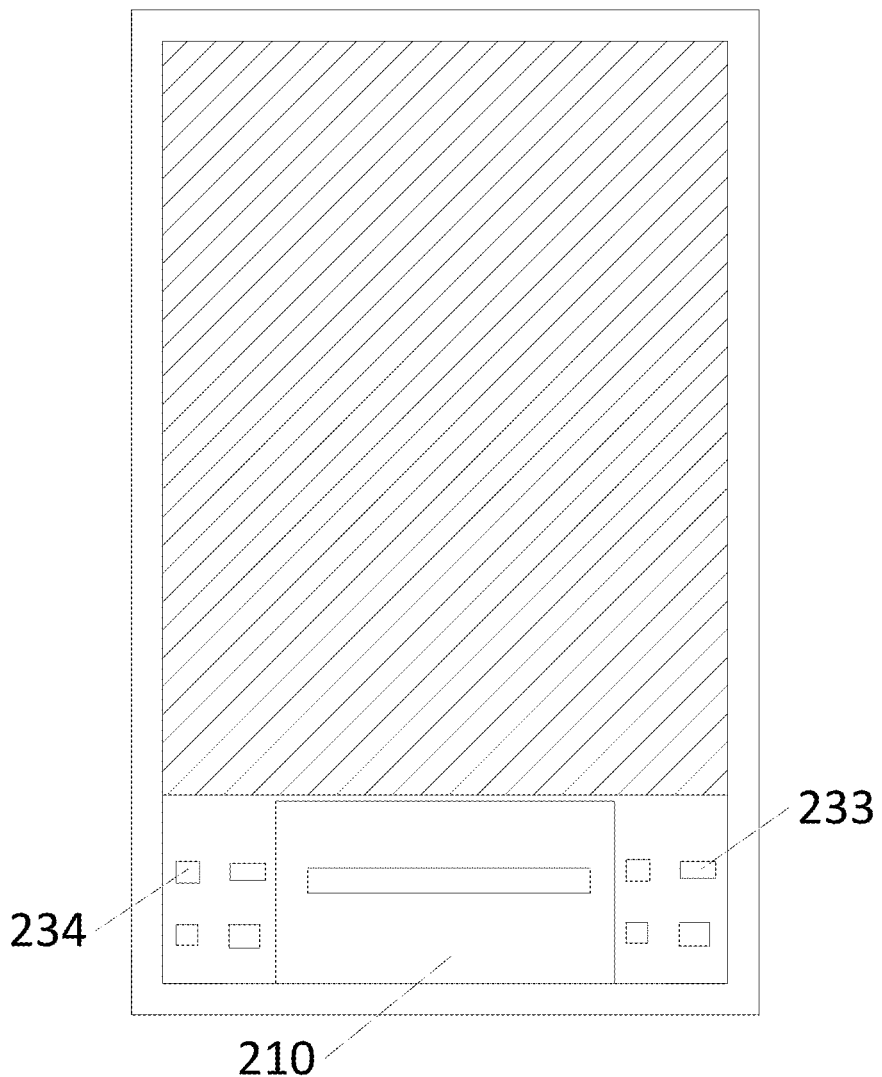
FIG. 9 is another top view of the flexible display module according to one embodiment of the present disclosure.

According to the flexible display module 200 in the embodiments of the present disclosure, the circuit board 230 includes the first FPC 231 and the first PCB 232, and the circuit board 230 is bent so that the first space is defined by the first FPC 231, the first PCB 232 and the flexible display panel 210. In this way, it is able to effectively reduce a space occupied by the circuit board 230, and provide a larger space for the whole-machine elements of the flexible display module 200 (e.g., the battery and the mainboard), as shown in FIG. 7 or 9, thereby to improve the overall performance of the flexible display module 200 (e.g., a battery life or a computing speed of the flexible display module 200), and improve the competitiveness and a recognition degree of the product. In addition, the electronic element 233 of the first PCB 232 is received in the first space, so as to protect the electronic element 233 or the driving chip from colliding with the whole-machine element, thereby to prolong a service life of the flexible display module 200.

In the related art, because the FPC is soft, it is impossible to secure the FPC after it has been folded or the FPC easily recovers from a folded state, thereby the electronic element on the FPC easily collides with the whole-machine element. However, through the circuit board 230 in the flexible display module 200, it is able to protect the electronic element from being damaged. To be specific, the first PCB 232 has sufficient rigidity, so it is able to secure the circuit board in a better manner and prevent the circuit board from recovering from the folded stated, thereby to protect the electronic element 233 stably. In addition, the electronic elements 233 are arranged on the first PCB 232 at a larger density, and more electronic elements 233 are allowed to be provided, so it is able to further reduce the space occupied by the circuit board 230, and provide a space for more whole-machine elements.

In the embodiments of the present disclosure, after the circuit board 230 has been folded, the space in the flexible display panel 210 for the whole-machine elements is indicated by a slashed region in FIG. 7 or 9. As compared with the space indicated by the slashed region in FIG. 1, the space for the whole-machine elements in the flexible display module 200 significantly increases, so it is able to provide a larger space for the whole-machine elements (e.g., the battery and the mainboard), thereby to improve the battery life and the computing speed of the flexible display module 200, and meet the user's requirement. In addition, under the condition that a total thickness of the circuit board 230 meets the requirement of the flexible display module 200 on thickness, all the vulnerable elements (the electronic elements 233) in the flexible display module 200 are received in the first space for protection, and the whole-machine elements are not stacked at, or not in contact with, the electronic elements 233 in the first space, so it is able to improve the reliability of the flexible display module 200.

In a specific embodiment of the present disclosure, the first PCB 232 is a multi-layer PCB, and the first FPC 231 is coupled to any layer of the first PCB 232.

To be specific, depending on the quantity of the electronic elements 233, the first PCB 232 is designed as a single-layer PCB, a double-layer PCB or a multi-layer PCB, so that metal lines are arranged at different layers of the PCB, thereby to increase the quantity of lines in the first PCB 232 and allow more electronic elements 233 to be arranged. In addition, the first FPC 231 is coupled to any layer of the first PCB 232. As shown in FIG. 4a, the first PCB 232 is a three-layer PCB, and the first FPC 231 is coupled to a top layer of the first PCB 232 through a via-hole to form a closed circuit. Alternatively, as shown in FIG. 4b, the first FPC 231 is coupled to a bottom layer of the first PCB 232 through a via-hole to form a closed circuit.

In the embodiments of the present disclosure, depending on different application scenarios, the electronic element 233 may be arranged at different positions of the first PCB 232. In addition, the first PCB 232 is bent in an adjustable direction for different practical applications, so it able to enlarge an application range of the flexible display module 200. In a specific embodiment of the present disclosure, the circuit board 230 includes a one-layer first FPC 231 and a multi-layer first PCB 232.

Figure 5:
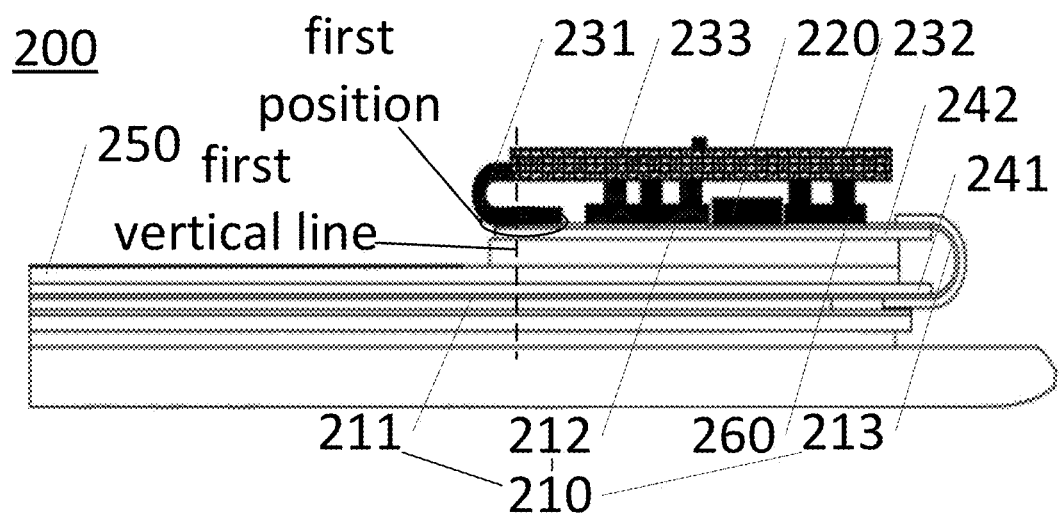
FIG. 5 is a sectional view of a flexible display module according to one embodiment of the present disclosure.
Figure 6:
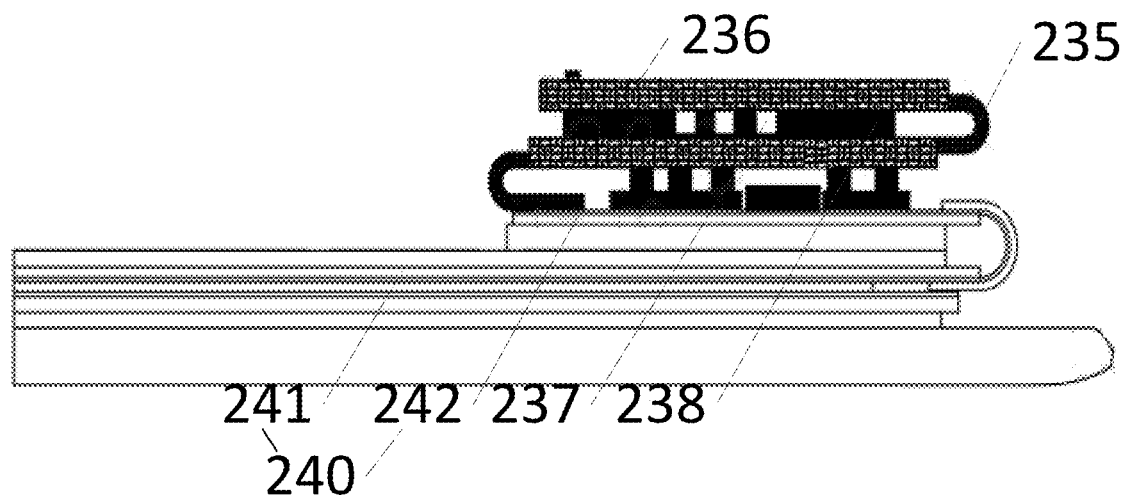
FIG. 6 is another sectional view of the flexible display module according to one embodiment of the present disclosure.

In a possible embodiment of the present disclosure, the first PCB 232 is arranged at a side of the driving chip 220 away from the flexible display panel 210. An orthogonal projection of the first PCB 232 onto the flexible display panel 210 covers the driving chip 220 and the electronic element 233, i.e., as shown in FIGS. 5 and 6, the orthogonal projection of the first PCB 232 after folding the circuit board 230 in a vertical direction covers orthogonal projections of the driving chip 220 and the electronic element 233 onto the flexible display panel 210. The electronic element 233 is arranged at a side surface of the first PCB 232 facing the flexible display panel 210, and the driving chip 220 is received in the first space, i.e., the driving chip 220 and the electronic element 233 are arranged below a lower surface of the folded first PCB 232 as shown in FIG. 5. In the embodiments of the present disclosure, the driving chip 220 and the electronic element 233 are received in the first space through the circuit board 230, so as to protect the driving chip 220 and the electronic element 233 from colliding with the whole-machine elements, and prevent the driving chip 220 and the electronic element 233 from being scraped due to an external force, thereby to improve the reliability of the flexible display module 200.

In a specific embodiment of the present disclosure, the flexible display module 200 includes a first adhesive 260 arranged at the bonding region 212 of the flexible display panel 210 and surrounding the driving chip 220. The electronic element 233 of the first PCB 232 is adhered to the bonding region 212 of the flexible display panel 210 through the first adhesive 260.

In the embodiments of the present disclosure, the electronic element of the first PCB 232 is adhered to the bonding region 212 of the flexible display panel 210 through the first adhesive 260, so as to secure the first PCB 232, and prevent the first PCB from shaking due to an external force or from being separated from the flexible display panel. In addition, through the first adhesive 260, it is able to prevent the electronic element 233 from colliding with the first FPC 231, thereby to prevent the electronic element 233 from being damaged. Furthermore, through the first adhesive 260 surrounding the driving chip 220, it is able to prevent the driving chip 220 from colliding with the electronic element 233 in the first space, secure the electronic element 233 on the first PCB 232, and prevent the driving chip from being damaged.

In a possible embodiment of the present disclosure, the first adhesive 260 is a foam adhesive tape.

Through the foam adhesive tape having an insulation characteristic, an electromagnetic shielding characteristic and excellent buffering performance, the electronic element 233 on the first PCB 232 is adhered to the bonding region 212 of the flexible display panel 210, so as to protect the electronic element 233 from being damaged due to an external force, prevent the driving chip from being damaged mechanically, prevent the mutual interference between the driving chip 220 and the electronic element 233, reduce an electromagnetic interference on the driving chip 220, and improve the operating performance of the driving chip 220, thereby to improve the operating efficiency of the flexible display module as a whole.

In a specific embodiment of the present disclosure, as shown in FIG. 6, the circuit board 230 further includes a second FPC 235 and a second PCB 236. The second FPC 235 is coupled to one end of the first PCB 232 away from the first FPC 231, and the second PCB 236 is coupled to one end of the second FPC 235 away from the first PCB 232. The second FPC 235 is bent, so as to control the second PCB 236 to rotate in a direction close to the bonding region of the flexible display panel 210. As shown in FIG. 6, the second PCB 236 rotates to be above the folded first PCB 232, and secured to the first PCB 232, i.e., the circuit board 230 is folded for the second time. A second space is defined by the second PCB 236, the second FPC 235 and the first PCB 232, and an electronic element 237 of the second PCB 236 is received in the second space for protection.

In the embodiments of the present disclosure, through the second FPC 235 and the second PCB 236, it is able to provide a small space ratio of the circuit board 230, provide a larger space for the whole-machine elements, and allow more electronic elements to be arranged, thereby to improve the performance of the flexible display module 200. In addition, it is able to prevent the electronic element 237 of the second PCB 236 from colliding with the whole-machine element.

It should be appreciated that, in a specific embodiment of the present disclosure, the circuit board 230 further includes a third FPC, a third PCB, a fourth FPC, a fourth PCB, and even more FPCs and PCBs. In other words, the circuit board 230 is capable of being folded multiple times according to the practical need, so as to allow more electronic elements to be arranged while ensuring a small space ratio of the circuit board 230.

In a specific embodiment of the present disclosure, an orthogonal projection of the second PCB 236 onto the flexible display panel 210 covers the electronic element 237 of the second PCB 236. As shown in FIG. 6, the orthogonal projection of the second PCB 236 onto the flexible display panel 210 covers an orthogonal projection of the electronic element 237 of the second PCB 236 onto the flexible display panel 210. The electronic element 237 is arranged on a lower surface of the second PCB 236, so as to prevent the electronic from interfering and colliding with the whole-machine elements, thereby to improve the reliability of the electronic element 237.

In a specific embodiment of the present disclosure, the second PCB 236 includes a second adhesive 238 arranged on a surface where the electronic element 237 is located, and the second PCB 236 is adhered to the first PCB 232 through the second adhesive 238.

In this way, it is able to secure the second PCB 236 and the first PCB 232, and prevent the second PCB from recovering from a folded state or from shaking due to an external force.

In a specific embodiment of the present disclosure, the second adhesive 238 surrounds the electronic element 237, so as to secure and protect the electronic element 237, prevent from the electronic element from interfering and colliding with the whole-machine element, and prevent from the electronic element from being damaged mechanically.

In another specific embodiment of the present disclosure, the second adhesive 238 is an insulating double-sided adhesive tape for adhering the first PCB 232 to the second PCB 236. In this way, it is able to improve the resistance of the electronic element 237 to electromagnetic interference while preventing the electronic element 237 from being damaged mechanically.

It should be appreciated that, the first adhesive 260 is made of a same material as, or different materials from, the second adhesive 238, e.g., they may be a foam adhesive tape and an insulating double-sided adhesive tape respectively, which will not be particularly defined herein. In a specific embodiment of the present disclosure, both the first adhesive 260 and the second adhesive 238 may be the foam adhesive tape or the insulating double-sided adhesive tape.

Figure 8:
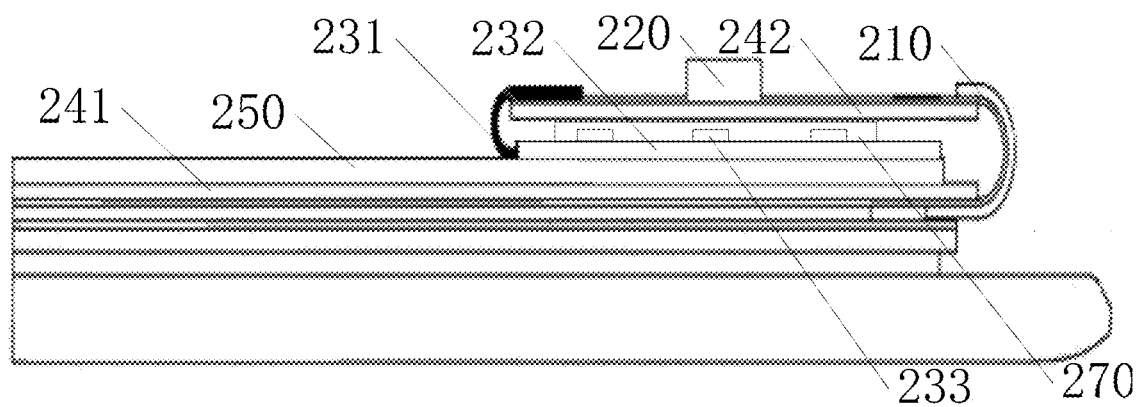
FIG. 8 is yet another sectional view of the flexible display module according to one embodiment of the present disclosure.

In a specific embodiment of the present disclosure, as shown in FIG. 8, the first PCB 232 of the flexible display module 200 is arranged at a side of the second flexible substrate 232 adjacent to the heat dissipation film 250. In other words, after the second flexible substrate 242 is bent relative to the first flexible substrate 241, the first PCB 232 is arranged between the second flexible substrate 242 and the heat dissipation film 250 and below the second flexible substrate 242. The electronic element 233 of the first PCB 232 is arranged at a side surface of the first PCB 232 facing the second flexible substrate 242, i.e., between the first PCB 232 and the second flexible substrate 242. In other words, the electronic element 233 is received in the first space defined by the first FPC 231, the first PCB 232 and the flexible display panel 210, so it is able to protect the electronic element 233.

It should be appreciated that, in the related art, as shown in FIGS. 2 and 3, usually the spacer 160 is arranged at a position corresponding to the flexible substrate 170, and after the flexible substrate 170 is bent, the flexible substrate 170 is attached to the spacer 160. In the embodiments of the present disclosure, the first PCB 232 servers as a filler (i.e., the spacer) in a gap between the second flexible substrate 242 and the heat dissipation film 250 in a bending process, so it is able to save the material for the spacer 160, and reduce the manufacture cost of the flexible display module 200, thereby to improve the competitiveness of the flexible display module 200. In addition, the folded first PCB 232 is arranged between the second FPC 232 and the heat dissipation film 250, so it is able to further reduce the space ratio of the circuit board 230, and provide a larger space for the whole-machine elements of the flexible display module 200 (e.g., the battery and the mainboard), thereby to improve the overall performance of the flexible display module 200 (e.g., the battery life and the computing speed), and improve the competitiveness and the recognition degree of the product. Furthermore, when the first PCB 232 is arranged between the second flexible substrate 242 and the heat dissipation film 250, it is able to reduce a thickness of the whole flexible display module 200, and provide a thin and light flexible display module 200.

Figure 11:
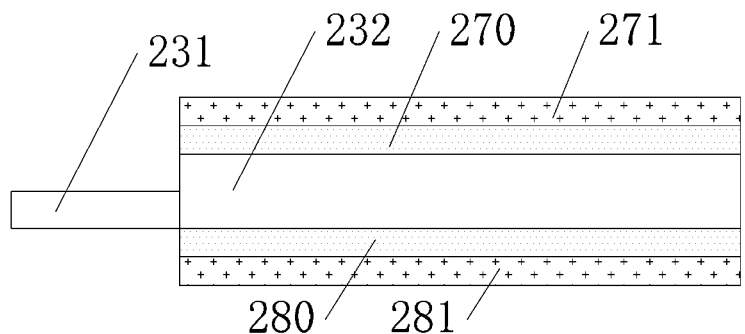
FIG. 11 is a sectional view of the circuit board according to one embodiment of the present disclosure.

In a specific embodiment of the present disclosure, the first PCB 232 includes a third adhesive 270 and a fourth adhesive 280 arranged at opposite side surfaces respectively. As shown in FIG. 11, the third adhesive 270 is arranged above the first PCB 232 and the fourth adhesive 280 is arranged below the first PCB 232. The first PCB 232 is adhered to the second flexible substrate 242 through the third adhesive 270, and adhered to the heat dissipation film 250 through the fourth adhesive 280.

In a specific embodiment of the present disclosure, as shown in FIG. 10, the first PCB 232 includes an adhesive region 290, and the electronic element 233 and the connector 234 arranged at two sides of the adhesive region 290. The electronic element 233 and the connector 234 are arranged at an upper surface of the first PCB 232, i.e., at a surface which is attached to the second flexible substrate 242. The third adhesive 270 and the fourth adhesive 280 are arranged at upper and lower surfaces of the first PCB 232 at positions corresponding to the adhesive region 290 respectively, i.e., the third adhesive 270 is arranged opposite to the fourth adhesive 280. In another specific embodiment of the present disclosure, the third adhesive 270 is arranged on the second flexible substrate 242, and the fourth adhesive 280 is arranged on the heat dissipation film 250. The first PCB 232 is adhered to the second flexible substrate 242 through the third adhesive 270 on the second flexible substrate 242, and adhered to the heat dissipation film 250 through the fourth adhesive 280 on the heat dissipation film 250. Positions of the third adhesive 270 and the fourth adhesive 280 will not be particularly defined herein.

In a specific embodiment of the present disclosure, the third adhesive 270 and the fourth adhesive 280 are each a foam adhesive tape or an insulating double-sided adhesive tape.

Through the foam adhesive tape and the insulating double-sided adhesive tape having an insulation characteristic, an electromagnetic shielding characteristic and excellent buffering performance on the upper and lower surfaces of the first PCB 232 respectively, the first PCB 232 is adhered to the heat dissipation film 250 and the second flexible substrate 242, so as to improve the resistance of the electronic element 233 to electromagnetic interference, reduce an electromagnetic interference on the electronic element 233, and improve the operating efficiency of the flexible display module as a whole.

It should be appreciated that, the first adhesive 260, the second adhesive 238, the third adhesive 270 and the fourth adhesive 280 are made of a same material or different materials, e.g., each of them may be a foam adhesive tape or an insulating double-sided adhesive tape, which will not be particularly defined herein. In a specific embodiment of the present disclosure, the first adhesive 260, the second adhesive 238, the third adhesive 270 and the fourth adhesive 280 may be all a foam adhesive tape or an insulating double-sided adhesive tape.

In the embodiments of the present disclosure, through the third adhesive 270 and the fourth adhesive 280, the first PCB 232 is adhered to the second flexible substrate 242 and the heat dissipation film 250, so as to prevent the first PCB 232 from shaking due to an external force or prevent the circuit board from being separated from the second flexible substrate 242 or the heat dissipation film 250, prevent the electronic element from shaking along with the first PCB, and prevent the normal use of the electronic element from being adversely affected.

In a specific embodiment of the present disclosure, a total thickness of the third adhesive 270, the third PCB 232 and the fourth adhesive 280 is 0.15 mm to 0.3 mm.

In other words, the total thickness of the third adhesive through which the first PCB 232 is adhered to the second flexible substrate, the fourth adhesive through which the first PCB 232 is adhered to the heat dissipation film 250 and the first PCB 232 is equal to a thickness of the spacer 160 desired for the bending process in the related art, so that the first PCB 232 is fully filled in a bending gap and replaces the spacer 160 for the bending process. In this way, it is able to save a spacer attaching process as well as a material of the spacer, thereby to reduce the manufacture cost of the flexible display module 200.

In a specific embodiment of the present disclosure, an orthogonal projection of the electronic element 233 onto the heat dissipation film 250 is outside an orthogonal projection of the second flexible substrate 242 onto the heat dissipation film 250, as shown in FIGS. 9 and 10. After the first PCB 232 has been attached to the second flexible substrate 242, the flexible display panel 210 is bent. When the first PCB 232 is attached to the heat dissipation film 250, the electronic elements 233 on the first PCB 232 are arranged at two sides of a region where the first PCB 232 is adhered to the second flexible substrate 242, i.e., the electronic element 233 and the connector 234 are exposed to be coupled to the mainboard or processor, so as to prevent the electronic element 233 from interfering with the flexible display panel 210, and ensure the normal operation of the electronic element 233 and the flexible display panel 210, thereby to ensure the reliability of the flexible display module 200.

Figure 12:
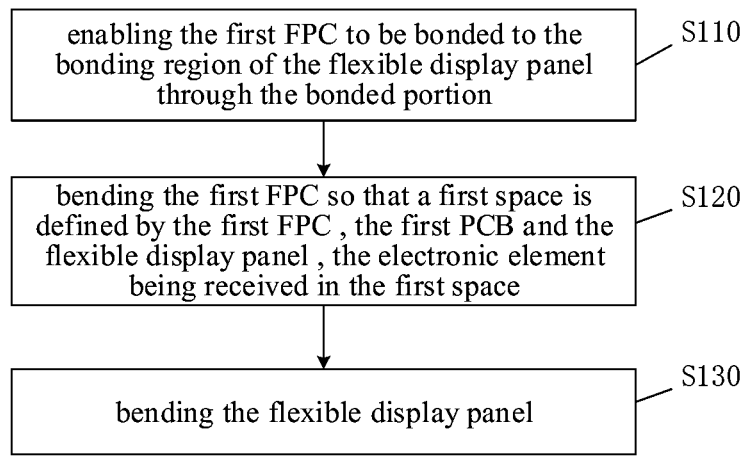
FIG. 12 is a flow chart of a method for manufacturing the flexible display module according to one embodiment of the present disclosure.
Figure 13:
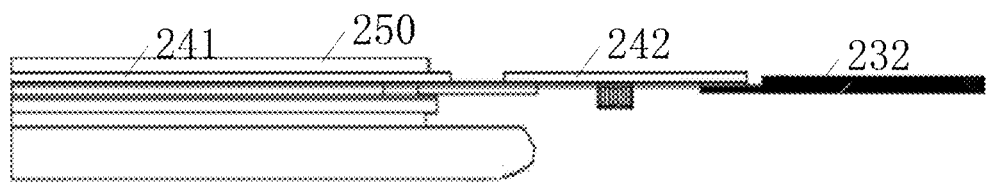
FIGS. 13 and 14 are schematic views showing the formation of the flexible display module according to one embodiment of the present disclosure.
Figure 14:
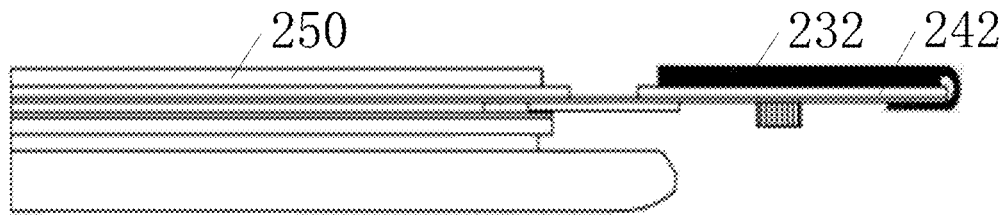

The present disclosure further provides in some embodiments a method for manufacturing the above-mentioned flexible display module 200 which, as shown in FIGS. 12 to 14, includes the following steps, i.e., S110, S120 and S130.

S110, enabling the first FPC 231 to be bonded to the bonding region 212 of the flexible display panel 210 through the bonded portion.

S120, bending the first FPC so that a first space is defined by the first FPC 231, the first PCB 232 and the flexible display panel 210, the electronic element 233 being received in the first space.

S130, bending the flexible display panel 210 so that the bonding region 212 is arranged at a side of the display region 211 opposite to a light-exiting side.

In a specific embodiment of the present disclosure, the flexible display module 200 further includes a flexible substrate 240 supporting the flexible display panel 210 and a heat dissipation film 250. Prior to S110, the method further includes: forming the flexible display panel 210 at a side surface of the flexible substrate 240, and forming a cover plate on the flexible display panel 210; forming the driving chip 220 at a side surface of the bonding region 212 of the flexible display panel 210 away from the flexible substrate 240; forming a gap region corresponding to the bending region 213 of the flexible display panel 210 on the flexible substrate 240 in accordance with the distribution of the display region, the bonding region 212 and the bending region 213 of the flexible display panel 210, the flexible substrate 240 including the first flexible substrate 241 and the second flexible substrate 242, the display region 211 of the flexible display panel 210 being arranged at one side of the first flexible substrate 241, the bonding region 212 of the flexible display panel 210 being arranged on the second flexible substrate 242, the driving chip 220 being arranged at a side of the bonding region 212 of the flexible display panel 210 away from the second flexible substrate 242; and forming the heat dissipation film 250 at a side surface of the first flexible substrate 241 away from the display region 211 of the flexible display panel 210.

In addition, it should be appreciated that, S120 of bending the first FPC so that the first space is defined by the first FPC, the first PBC and the flexible display panel may also be performed subsequent to S130 of bending the flexible display panel, i.e., the flexible display panel is bent, and then the first PBC is bent relative to the first FPC. An order of the steps of the method will not be particularly defined herein.

In a specific embodiment of the present disclosure, the bending the first FPC so that the first space is defined by the first FPC, the PBC and the flexible display panel includes bending the first FPC and enabling the first PBC 232 to move in a direction close to the driving chip 220, so that the first PCB 232 is arranged at a side of the driving chip 220 away from the flexible display panel 210 and the first space is defined by the first FPC, the first PBC and the bonding region. The electronic element 233 is arranged at a surface of the first PCB 232 facing the flexible display panel 210, and the driving chip 220 is received in the first space.

In a specific embodiment of the present disclosure, after the circuit board 230 has been bonded to the bonding region 212 of the flexible display panel 210 through the bonded portion of the first FPC 231 and a related process about the flexible display panel 210 has been completed, the first adhesive 260 surrounding the driving chip 220 is attached onto a surface of the flexible display panel 210 where the driving chip 220 is located (i.e., a side surface of the bonding region 212 of the flexible display panel 210 away from the second flexible substrate 242), and the first PCB 232 is rotated in a direction close to the driving chip 220 (i.e., the first PCB 232 is bent downwardly), so that the first PCB 232 is arranged at a side of the driving chip 220 away from the flexible display panel 210, and the electronic element 233 of the first PCB 232 is in contact with, and adhered to, the first adhesive 260 on the flexible display panel 210.

In this way, it is able to prevent the first PCB from recovering from a folded stated.

The driving chip 220 is received in the first space defined by the first FPC 231, the first PBC 232 and the bonding region 212 of the flexible display panel 210. Finally, the flexible display panel 210 and the flexible substrate are bent, so that the bonding region 212 are arranged at a side of the display region 211 opposite to the light-exiting side.

In a specific embodiment of the present disclosure, the bending the first FPC so that the first space is defined by the first FPC, the first PBC and the flexible display panel includes bending the first FPC 231 so that the first PBC 232 is arranged at a side of the second flexible substrate 242 away from the flexible display panel 210, and the electronic element 233 is arranged at a side surface of the first PBC 232 facing the second flexible substrate 242. The bending the flexible display panel 210 includes bending the flexible display panel and the flexible substrate so that the first PBC 232 is attached to the heat dissipation film 250.

In a specific embodiment of the present disclosure, as shown in FIGS. 13 and 14, after the circuit board 230 has been bonded to the bonding region 212 of the flexible display panel 210 through the bonded portion of the first FPC 231 and the related process about the flexible display panel 210 has been completed, a structure as shown in FIG. 13 is formed. The first PCB 232 includes an adhesive region 290, and the electronic element 233 and the connector 234 arranged at two sides of the adhesive region 290. The electronic element 233 and the connector 234 are arranged at an upper surface of the first PCB 232, i.e., a surface attached to the second flexible substrate 242. The third adhesive 270 and the fourth adhesive 280 are arranged on an upper surface and a lower surface of the first PCB 232 at positions corresponding to the adhesive region 290 respectively.

The circuit board 230 is bent, i.e., the first FPC is bent so that the first PCB 232 is rotated in a direction away from the driving chip 220 (i.e., bent upwardly as shown in FIG. 13). The first PCB 232 is adhered to the second flexible substrate 242 through the third adhesive 270, the first PCB 232 is arranged at a side of the second flexible substrate 242 away from the flexible display panel 210, and the electronic element 233 is arranged between the first PCB 233 and the second flexible substrate 242.

Next, the bending process is performed, i.e., the flexible substrate is bent. Then, the first PCB 232 is attached to the heat dissipation film 250 at a back surface of the display region 211 of the flexible display panel 210 through the fourth adhesive 280.

The bonding region 212 is arranged at a side of the display region 211 away from the light-exiting side, i.e., the first PCB 232 is arranged between the first flexible substrate 241 and the second flexible substrate 242, so as to form a structure as shown in FIG. 8. In this way, it is able to make full use of the space of the flexible display panel 210. In addition, the spacer 160 is replaced with the first PCB 231 to directly fill the bending gap between the second flexible substrate 242 and the heat dissipation film 250 caused by the bending process, so it is able to save a process of attaching the spacer as well as a material of the spacer, simplify the manufacture of the flexible display module 200, and reduce the manufacture cost thereof, thereby to improve the competitiveness of the flexible display module.

FIG. 9 is a top view of the flexible display module 200 obtained through the above-mentioned method. The space for the whole-machine elements of the flexible display module 220 through bending the circuit board 230 is indicated by the slashed region in FIG. 9. In addition, the electronic elements 233 are arranged at two sides of the bonding region 212 of the flexible display panel 210, and as compared with the conventional flexible display module in FIG. 1, it is able to significantly increase the space for the battery and the mainboard, thereby to improve the battery life and the computing speed of the flexible display module, meet the user's requirement, and improve the competitiveness of the flexible display module. In addition, in the method according to the embodiments of the present disclosure, it is able to save a process of attaching the spacer, a material of the spacer, and the cost caused by an attachment device, thereby to reduce the manufacture cost of the flexible display module, reduce the probability of a defective product when the spacer is attached wrongly, improve the yield of the flexible display module, and improve the price competitiveness of the flexible display module. Furthermore, when the spacer 160 is replaced with the first PCB 232 to fill the bending gap, it is able to reduce a thickness of the whole flexible display module, and provide a thin and light flexible display module.

In another specific embodiment of the present disclosure, the circuit board 230 further includes an upper protection film 271 arranged above the third adhesive 270 and a lower protection film 281 arranged below the fourth adhesive 280. The upper protection film 271 and the lower protection film 281, e.g., a polyethylene terephthalate (PET) film, are used to protect the third adhesive 270 and the fourth adhesive 280 respectively. Before the first PCB 232 is attached to the second flexible substrate 242, the upper protection film 271 on the third adhesive 270 is removed to expose the third adhesive 270. Before the first PCB 232 is attached to the heat dissipation film 250, the lower protection film 281 on the fourth adhesive 280 is removed to expose the fourth adhesive 281.

The present disclosure further provides in some embodiments a flexible display device including the above-mentioned flexible display module 200. The flexible display device may be any product or member having a display function, e.g., electronic paper, mobile phone, tablet computer, television, display, laptop computer, digital photo frame or navigator, which will not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A flexible display module, comprising a flexible display panel, and a driving chip and a circuit board arranged on the flexible display panel,
    wherein the flexible display panel comprises a display region and a bonding region arranged at a side of the display region opposite to a light-exiting side, and a bending region between the display region and the bonding region;
    wherein the driving chip and the circuit board are in the bonding region;
    wherein the flexible display module further comprises a flexible substrate supporting the flexible display panel, the flexible substrate comprises a first flexible substrate and a second flexible substrate, the first flexible substrate is coupled to one end of the bending region, and one end of the second flexible substrate is coupled to the other end of the bending region;
    wherein the bonding region of the flexible display panel is on the second flexible substrate;
    wherein the circuit board is coupled to the other end of the second flexible substrate at a first position;
    wherein an orthographic projection of the driving chip onto a plane where the first flexible substrate is located and an orthographic projection of the bending region onto the plane where the first flexible substrate is located are both located on a same side of a first vertical line, and the first vertical line is a vertical line at the first position and perpendicular to the first flexible substrate;
    wherein the driving chip is arranged on a side of the second flexible substrate away from the first flexible substrate;
    wherein the circuit board comprises a first flexible printed circuit, and a first printed circuit board provided with a first electronic element and coupled to one end of the first flexible printed circuit, and the first flexible printed circuit is coupled to the bonding region of the flexible display panel;
    wherein a first adhesive surrounding the driving chip is arranged on the second flexible substrate, and the first electronic element is adhered to the bonding region of the flexible display panel through the first adhesive.

2. The flexible display module according to claim 1, wherein the circuit board is electrically connected to the bonding region, and the driving chip is arranged between the circuit board and the second flexible substrate.

3. The flexible display module according to claim 1, wherein a connector is arranged on the first printed circuit board, and wherein the connector is used to coupled to a mainboard or a processor;
    wherein an orthographic projection of the first printed circuit board onto the plane where the first flexible substrate is located covers orthographic projections of the connector and first electronic element onto the plane where the first flexible substrate.

4. The flexible display module according to claim 3, wherein both the connector and first electronic element are on a same side of the first printed circuit board close to the first flexible substrate, or, the connector and first electronic element respectively located on a side of the first printed circuit board close to the first flexible substrate and a side of the first printed circuit board away from the first flexible substrate.

5. The flexible display module according to claim 1, wherein the first printed circuit board is a multi-layer printed circuit board, and the first flexible printed circuit is coupled to any layer of the first printed circuit board.

6. The flexible display module according to claim 1, wherein the first adhesive is a foam adhesive tape.

7. The flexible display module according to claim 1, wherein the circuit board further comprises a second flexible printed circuit and a second printed circuit board, the second flexible printed circuit is coupled to one end of the first printed circuit board away from the first flexible printed circuit,
    wherein a second electronic element is arranged on a side of the second printed circuit board close to the second flexible substrate;
    wherein an orthographic projection of the second electronic element onto the plane where the first flexible substrate is located at least partially overlaps an orthographic projection of the driving chip onto the plane where the first flexible substrate is located.

8. The flexible display module according to claim 7, wherein the second printed circuit board comprises a second adhesive arranged on a surface where the second electronic element is located, and the second printed circuit board is adhered to the first printed circuit board through the second adhesive.

9. The flexible display module according to claim 8, wherein the second adhesive is an insulating double-sided adhesive tape.

10. The flexible display module according to claim 1, further comprising a heat dissipation film, wherein the heat dissipation film is arranged on a side of the first flexible substrate away from the light-exiting side, and the display region is arranged on a side of the first flexible substrate close to the light-exiting side;
    wherein the circuit board is on a side of the second flexible substrate away from the heat dissipation film.

11. A flexible display module, comprising a flexible display panel, and a driving chip and a circuit board arranged on the flexible display panel,
    wherein the flexible display panel comprises a display region and a bonding region arranged at a side of the display region opposite to a light-exiting side, and a bending region between the display region and the bonding region;
    wherein the driving chip and the circuit board are in the bonding region;
    wherein the flexible display module further comprises a flexible substrate supporting the flexible display panel, the flexible substrate comprises a first flexible substrate and a second flexible substrate, the first flexible substrate is coupled to one end of the bending region, and one end of the second flexible substrate is coupled to the other end of the bending region;

wherein the bonding region of the flexible display panel is on the second flexible substrate;

wherein the circuit board is coupled to the other end of the second flexible substrate at a first position;

wherein an orthographic projection of the driving chip onto a plane where the first flexible substrate is located and an orthographic projection of the bending region onto the plane where the first flexible substrate is located are both located on a same side of a first vertical line, and the first vertical line is a vertical line at the first position and perpendicular to the first flexible substrate;

wherein the circuit board comprises a first flexible printed circuit, and a first printed circuit board provided with one or more electronic elements and coupled to one end of the first flexible printed circuit, and the first printed circuit board is coupled to one end of the first flexible printed circuit;

wherein the flexible display module further comprises a heat dissipation film, wherein the heat dissipation film is arranged on a side of the first flexible substrate away from the light-exiting side, and the display region is arranged on a side of the first flexible substrate close to the light-exiting side;

wherein the first printed circuit board is arranged at a side of the second flexible substrate adjacent to the heat dissipation film, and both the first printed circuit board and the heat dissipation film are on a same side of the first flexible substrate close to the second flexible substrate.

12. The flexible display module according to claim 11, wherein the driving chip is arranged on a surface of the second flexible substrate away from the first printed circuit board, and an orthographic projection of the driving chip onto the first printed circuit board at least partially overlaps orthographic projections of the electronic elements onto the first printed circuit board.

13. The flexible display module according to claim 11, wherein the first printed circuit board comprises an adhesive region, and the electronic elements are arranged at two sides of the adhesive region.

14. The flexible display module according to claim 11, wherein the first printed circuit board comprises a third adhesive and a fourth adhesive arranged at opposite surfaces respectively, the first printed circuit board is adhered to the second flexible substrate through the third adhesive, and the first printed circuit board is adhered to the heat dissipation film through the fourth adhesive.

15. The flexible display module according to claim 14, wherein the third adhesive, the first printed circuit board and the fourth adhesive have a total thickness of 0.15 mm to 0.3 mm.

16. The flexible display module according to claim 14, wherein a material of the third adhesive and a material of the fourth adhesive are the same or different, wherein the material of the third adhesive and the material of the fourth adhesive are each a foam adhesive tape or an insulating double-sided adhesive tape, or the material of the third adhesive and the material of the fourth adhesive are a foam adhesive tape and an insulating double-sided adhesive tape respectively.

17. The flexible display module according to claim 1, further comprising a heat dissipation film, wherein the heat dissipation film is arranged on a side of the first flexible substrate away from the light-exiting side, and the display region is arranged on a side of the first flexible substrate close to the light-exiting side;

wherein an orthogonal projection of the first electronic element onto the heat dissipation film is outside an orthogonal projection of the second flexible substrate onto the heat dissipation film.

18. A flexible display device comprising the flexible display module according to claim 1.

19. The flexible display device according to claim 18, wherein the circuit board is electrically connected to the bonding region, and the driving chip is arranged between the circuit board and the second flexible substrate.

20. The flexible display device according to claim 18, wherein a connector is arranged on the first printed circuit board, and wherein the connector is used to coupled to a mainboard or a processor;

wherein an orthographic projection of the first printed circuit board onto the plane where the first flexible substrate is located covers orthographic projections of the connector and first electronic element onto the plane where the first flexible substrate.

* * * * *